US006822444B2

(12) United States Patent
Lai

(10) Patent No.: US 6,822,444 B2
(45) Date of Patent: Nov. 23, 2004

(54) WIDEBAND NQR SYSTEM USING MULTIPLE DE-COUPLED RF COILS

(75) Inventor: Ching-Ming Lai, Wakefield, MA (US)

(73) Assignee: Analogic Corporation, Peabody, MA (US)

( * ) Notice: Subject to any disclaimer, the term of this patent is extended or adjusted under 35 U.S.C. 154(b) by 0 days.

(21) Appl. No.: 10/374,364

(22) Filed: Feb. 25, 2003

(65) Prior Publication Data

US 2004/0196036 A1 Oct. 7, 2004

Related U.S. Application Data

(60) Provisional application No. 60/422,246, filed on Oct. 30, 2002.

(51) Int. Cl.[7] .................................................. G01V 3/00
(52) U.S. Cl. ...................................... 324/300; 324/307
(58) Field of Search ................................ 324/300, 307, 324/309, 319, 322, 318, 314; 600/420; 128/652.5

(56) References Cited

U.S. PATENT DOCUMENTS

| 3,643,181 | A | * | 2/1972 | Stirrat et al. ................. 332/120 |
| 5,592,083 | A | | 1/1997 | Magnuson et al. ......... 324/300 |
| 5,608,321 | A | | 3/1997 | Garroway et al. .......... 324/307 |
| 5,719,499 | A | * | 2/1998 | Chandrakumar ............ 324/322 |
| 6,100,688 | A | * | 8/2000 | Smith et al. ................. 324/300 |
| 6,150,816 | A | * | 11/2000 | Srinivasan ................... 324/318 |
| 6,392,408 | B1 | * | 5/2002 | Barrall et al. ................ 324/300 |
| 6,486,838 | B1 | | 11/2002 | Smith et al. ................. 343/703 |
| 6,522,135 | B2 | * | 2/2003 | Miller et al. ................. 324/300 |
| 6,566,873 | B1 | * | 5/2003 | Smith et al. ................. 324/300 |
| 6,577,128 | B1 | | 6/2003 | Smith et al. ................. 324/309 |
| 2003/0071619 | A1 | * | 4/2003 | Sauer et al. ................. 324/307 |

* cited by examiner

Primary Examiner—Brij B Shrivastav
(74) Attorney, Agent, or Firm—McDermott Will & Emery LLP

(57) ABSTRACT

A wideband NQR detection system includes an RF coil system having a plurality of RF coils that can be used to excite and detect a plurality of NQR spectral lines at the same time. Each of the plurality of RF coils is shaped and configured so as to generate, when driven by RF pulses, RF fields that are substantially de-coupled, for example by being mutually orthogonal. In this way, each coil can function independently, without affecting the operation of any other coil. The RF pulses used to excite NQR resonances can be prepared digitally, as a composite waveform formed as a superposition of individual waveforms, each optimally tailored to excite one spectral line. The wideband NQR detection system also includes a wideband transmitter for generating and transmitting RF pulses, and a wideband receiver for receiving the NQR response signals detected by the coils.

25 Claims, 9 Drawing Sheets

WIDEBAND NQR SYSTEM USING MULTIPLE DE-COUPLED RF COILS

CROSS REFERENCES TO RELATED APPLICATIONS

This application claims the benefit of priority under 35 U.S.C. §119(e) from co-pending, commonly owned U.S. provisional patent application Ser. No. 60/422,246, entitled "A Wideband NQR System With Three Orthogonal RF Coils," filed on Oct. 30, 2002.

FIELD OF THE INVENTION

The present invention relates to a method and system for detecting explosives and narcotics. More particularly, the invention relates to a nuclear quadrupole resonance (NQR) method and system for detecting target substances contained in explosives and narcotics.

BACKGROUND

There is a growing demand for more efficient and reliable systems for detecting and identifying substances such as explosives and narcotics. These systems are useful in a number of applications, including luggage or mail searches, land mine detection, and the control of illegal drug traffic, to name just a few.

It is recognized that NQR (nuclear quadrupole resonance) spectroscopy is a useful technique for detecting explosives and narcotics. While NQR is related to the better-known NMR (nuclear magnetic resonance) spectroscopic technique, NQR has a number of features that distinguish it from NMR.

NMR is based on the principle that: 1) a nucleus with non-zero total spin can be viewed as being characterized by an intrinsic net magnetic moment, which is polarized by a static external magnetic field $B_0$; and 2) upon application of an oscillating RF magnetic field (at the correct resonant frequency) to the polarized nuclear magnetic moment, a resonance phenomenon occurs, resulting in the emission by the nucleus of a NMR response signal.

In NMR, the strength of the external static magnetic field $B_0$ determines the amplitude and frequency of the NMR resonance signal. It is therefore advantageous to provide as strong an external magnetic field as possible. The strength of the $B_0$-field in NMR systems is typically in the range of four or five orders of magnitude higher than the strength of the earth's magnetic field. In order to induce nuclear magnetic resonance, a sample is typically placed inside a large magnet with a strong $B_0$ field, to yield a net magnetization along the $B_0$ field.

The typical range of NMR resonant frequencies is from about 10 MHz to about 500 MHz, depending on the $B_0$ field strength and the specific nucleus. The NMR resonance frequencies shift slightly (on the order of several parts per million) for a given nucleus from one chemical bond to another. The external static $B_0$-field must be quite homogeneous, in order to obtain a high-resolution spectrum that can provide useful information for studying molecular structure and other characteristics of interest. However, without knowing the compound within a sample, it is in general difficult to determine or identify a specific molecule from the NMR spectrum.

Nuclei that have a non-spherical charge distribution and a spin $[\geq]$ have, in addition to a magnetic moment, an electric quadrupole moment that is representative of the degree of deviation of the shape of a nucleus from a sphere. Nuclei having a non-zero electric quadrupole moment will be referred to in this application as "quadrupolar nuclei." In NQR, the electric quadrupole moment of a quadrupolar nucleus interacts with the gradient of the local atomic electric field. This electrical interaction provides the mechanism for transitions between energy levels. However, these transitions, i.e. resonances, are initiated and observed through the magnetic moment $\mu$ of the nucleus. Therefore, NQR measurements do not require the provision of a static external magnetic field.

In NQR, the electric field gradient ("EFG") polarizes the electric quadrupole moments, and thus exerts torque on the quadrupolar nuclei. The nuclei precess (under a simplistic "classical" picture) about the EFG, as a result of the external torque and the angular momentum that the nuclei possess. The frequency of precession matches the energy differences between excited and non-excited nuclear states.

By analogy to NMR, the net magnetization of an object containing quadrupolar nuclei can be observed as an NQR response signal, by inducing excitations to higher energy nuclear quadrupole states through the application of an oscillating RF field. The oscillating RF field may be an RF pulse of finite duration, and has oscillation frequencies that match the frequencies of the allowed transitions between the different nuclear energy levels. As in NMR, NQR response signals are emitted as the nucleus returns to its original, lower energy state.

A number of quadrupolar nuclei are commonly present in many explosives and narcotics. These quadrupolar nuclei include, inter alia, nitrogen ($^{14}$N, having spin I=1) and chlorine ($^{35}$Cl and $^{37}$Cl). In particular, nitrogen is present in most explosives, most explosives being nitrogen-containing crystalline solids. The NQR response signals for nitrogen nuclei range from several hundred kilohertz to a few megahertz. Typically, the NQR frequency range for most substances is less than about 6 MHz or so. In NQR, the strength of the EFG determines the NQR signal amplitude and frequency. In addition, the NQR signal amplitude also depends on the angle between the EFG and the RF field.

One advantage of NQR is high specificity: NQR response signals are very well-defined, i.e. are unique and specific to the particular type of molecule or compound being detected. A given quadrupolar nucleus sends out a distinctive NQR response signal, depending on the specific location of the nucleus within a molecular structure, as well on the specific molecule. Because of the wide variation in the local electric field gradient, the NQR frequencies differ considerably for a given nucleus situated in different locations within a given molecule, as well as in different molecules.

The NQR spectrum of a quadrupolar nucleus from a single type of molecule has multiple peaks, each peak being referred to as a spectral line. Generally, these spectral lines are at frequencies that are far away from each other, and also far away from the spectral lines of other types of molecules. Because of such a wide separation of the spectral lines, NQR provides a reliable method for identifying the specific quadrupolar nuclei, and for differentiating between chemical compounds that exhibit NQR responses. Because of their specificity, NQR spectral lines carry a distinctive signature for various types of narcotics, such as cocaine or heroine, and for various types of explosives containing nitrogen molecules.

Another advantage of NQR is that NQR measurements do not require an object to be placed in a strong, external magnetic field, as in NMR. In NMR, the sample is surrounded by static magnetic field coils and other gadgetries that produce the strong external $B_0$ field. Therefore, the accessibility and configuration of NMR systems are limited. Also, most of the cost in NMR system is directed to the provision of strong, static magnetic fields. Therefore, NQR is more cost-effective, compared to NMR.

For these reasons, NQR provides an effective and practical technique for detecting explosives and narcotics. Despite these advantages, however, a major drawback of NQR measurements as performed in the prior art is that in typical situations, the NQR signal is inherently weak. It is necessary to tune the receiving RF coil to a narrow frequency range to minimize the noise. Even so, the NQR signal has to be collected repetitively and averaged over time, in order to achieve adequate signal-to-noise ratio for analysis and detection. If there is only one chemical to detect, the required time for such detection may not be too bad. However, in most cases, it is necessary to detect multiple chemical compounds. The required measurement time may become excessive, and thus the method may become impractical.

Accordingly, there is a need for an NQR detection system that has an improved efficiency, and thus allows for a reduced detection time. If many NQR spectral lines could be excited and detected at the same time, the total amount of measurement time could be greatly reduced. Further, by simultaneously collecting multiple NQR spectral lines of a chemical compound, the accuracy in identifying the chemical compound would be enhanced. It is therefore desirable to provide an NQR detection system that is capable of efficiently exciting and detecting multiple NQR spectral lines simultaneously.

SUMMARY OF THE INVENTION

The present invention provides a wideband NQR system that allows many spectral lines to be excited and detected at the same time. The wideband NQR system of the present invention includes a novel RF coil system having at least two RF coils that are shaped and configured to generate RF fields that are substantially de-coupled from each other. Each coil therefore can function completely independently, and the coil system can excite and detect multiple NQR spectral lines simultaneously.

A discovery of the present invention is that multiple RF coils can be used to perform simultaneous NQR excitation and detection over a given volume of an object that contains or conceals compounds that include one or more quadrupolar nuclei, if these RF coils are designed so as to generate RF magnetic fields that are substantially de-coupled from each other. For example, the RF fields may be substantially de-coupled by virtue of being mutually orthogonal. Because the RF fields generated by the RF coils are de-coupled, each RF coil can operate at different frequencies (or sets of frequencies), without any interference from each other. Each RF coil can be tuned to multiple resonant frequencies that match the characteristic transition frequencies of the NQR spectral lines of interest. Collectively, it is possible for the multiple RF coils to cover the entire frequency range for most, if not all, spectral lines of interest.

In one embodiment of the invention, a wideband NQR system for detecting NQR spectral lines includes a wideband transmitter for generating and transmitting pulsed RF signals. At least two RF coils are shaped and configured to generate, when driven by these RF signals, RF electromagnetic fields that are mutually orthogonal and substantially de-coupled, so that a plurality of nuclear quadrupole resonances are excited when the mutually orthogonal RF fields are applied to at least a portion of an object containing quadrupolar nuclei, at frequencies matching characteristic transition frequencies for the excited resonances. Preferably, the same de-coupled RF coils are used to detect the NQR response signals. The NQR system also includes a wideband receiver for receiving the detected NQR response signals.

DETAILED DESCRIPTION OF THE PREFERRED EMBODIMENTS

The present invention is directed to a wideband NQR system, featuring an RF coil system that is designed so as to allow the simultaneous excitation and detection of multiple NQR spectral lines. The efficiency of NQR detection is thereby significantly enhanced. Using the wideband NQR system of the present invention, the NQR signals for many spectral lines of interest can be detected simultaneously from a desired region or volume within an object that contains compounds that include quadrupolar nuclei. Moreover, such simultaneous detection can be achieved without subjecting the spectral lines to signal-to-noise degradation.

Figure 1:
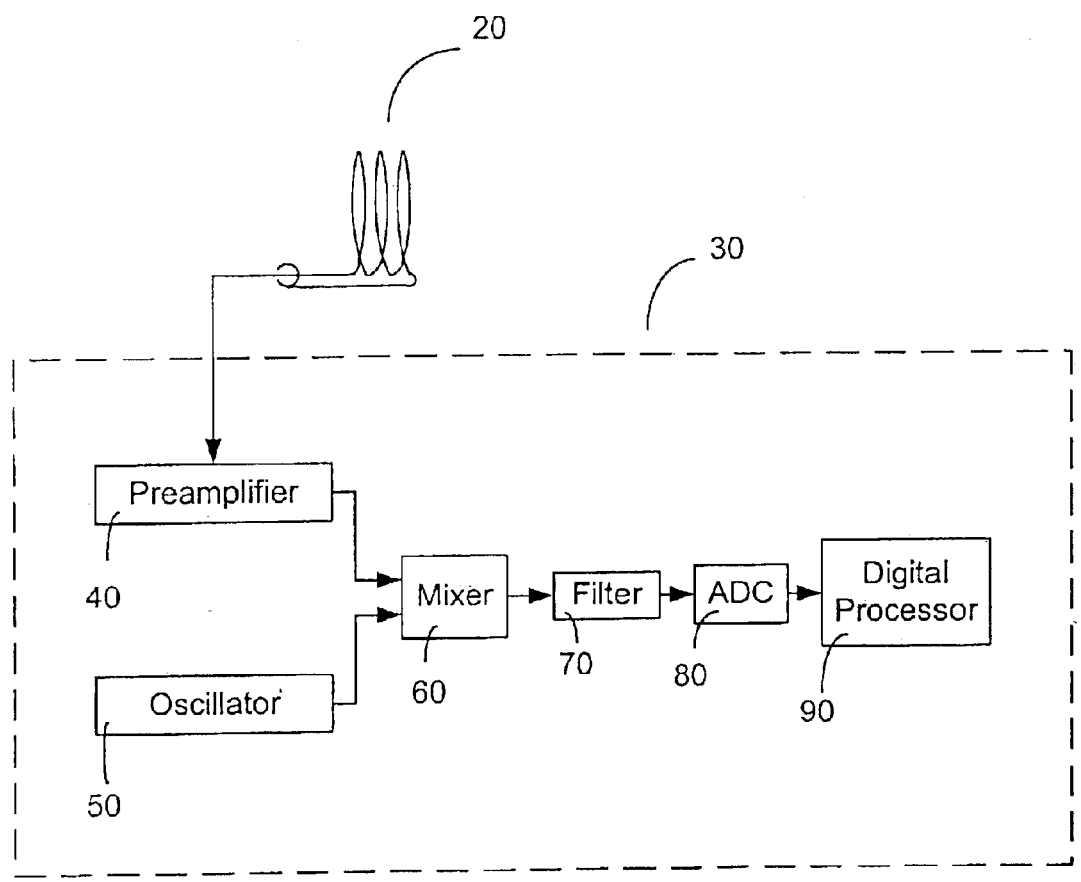
FIG. 1 shows an RF coil and a receiver, in a prior art narrowband NQR system that includes a single RF coil tuned to a single frequency.

FIG. 1 schematically illustrates an RF coil 20 and a receiver 30, in a prior art narrowband NQR system that includes a single RF coil tuned to a single frequency. As explained earlier, the NQR signal is relatively weak, under normal conditions. Although the signal-to-noise ratio can be improved by averaging over time, it is desirable to use other methods that do not require an increase in measurement time. Various efforts have been made in the prior art to increase the NQR signal strength, for example by using better pulse sequences, or by undertaking procedures for enhancing the magnetization of the object being examined. Attempts have also been made to reduce the noise level by improving the design of the RF amplifier, the RF coil, or the RF shielding, by way of example.

In the prior art NQR system illustrated in FIG. 1, the RF coil 20 is typically designed with inductive and capacitive components in such a way that the coil resonates at the frequency of the spectral line being detected. As in the embodiment shown in FIG. 1, the RF coil 20 can also function as a pickup coil for NQR response signals. The NQR signal picked up from the RF coil 20 is sent to the receiver 30, which is a narrowband receiver. The receiver 30 includes an RF preamplifier 40 for stabilizing the NQR signal received from the RF coil 20. The receiver 30 further includes an oscillator 50 and a mixer 60 for downshifting the NQR signal to audio-frequency ranges. The mixer 60 downshifts the RF signal frequencies of the NQR signal, by mixing the signal with signals generated by the local oscillator. The receiver 30 further includes a filter 70 and a digitizer 80. The audio-frequency signal coming out from the mixer 60 is filtered by the filter 70. The filtered signal is digitized by the digitizer 80. The RF circuit may also include an impedance match network (not shown) for providing an equivalent resistive impedance. The equivalent resistive impedance may be about 50 ohm, which is usually the input impedance to the RF preamplifier 40.

The receiver 30 further includes a digital processor 90 for processing the digitized signal. In particular, a Fourier transform of the digitized data transforms the time-domain signals into the desired NQR spectrum, over an appropriate narrow frequency range. In order to prevent noise from being aliased into the final audio-frequency signal, the combined bandwidth of the preamplifier 40 and the filter 70 should not exceed this range too much.

The major source of thermal noise in prior art narrowband NQR systems of the type illustrated in FIG. 1 is coil resistance, which any RF coil inevitably contains. It is desirable to minimize the coil resistance, as much as possible. Coil resistance dampens the response signal, and represents the loss of the RF resonant circuit. Coil resistance also determines the bandwidth of the RF circuit. When the coil resistance is low, the resonant circuit has high quality factor Q, and a narrowband response signal with a high signal-to-noise ratio is obtained. Conversely, if the coil resistance is relatively high, the resonant circuit has a low Q. This results in an undesirable increase in bandwidth and in thermal noise.

In order to reduce thermal noise, the resistance of the RF coil is kept as low as possible. Consequently, the bandwidth of the RF circuit is narrow, as in prior art narrowband NQR systems of the type illustrated in FIG. 1. In order to detect NQR spectral lines, the frequency of the RF resonant circuit has to be tuned with sufficient accuracy. As mentioned earlier, however, in NQR the spectral lines of interest are widely separated. This means that the RF coil can only pick up, at any given time, the NQR signal for a single spectral line. Usually, many spectral lines are needed in order to identify multiple chemical compounds. Using prior art NQR systems, these spectral lines can only be picked up one line at a time. The total measurement time is thus proportional to the number of spectral lines under detection. As the number of spectral lines that must be detected increases, the total measurement time may become too long for the NQR method to be practicable.

Another factor that can reduce the Q of an RF coil is the increase in the effective resistance of the RF coil, resulting from the coupling of the RF coil to the object under detection, when the object is placed within the sensitive volume of the RF coil. Because of such a coupling, the RF coil is subject to additional losses. The Q-value of the resonant circuit is reduced, and the bandwidth becomes broader. In MRI, the human body causes quite a bit of loss in the RF signal, and is usually the predominant source of thermal noise, as well as the major factor for determining the Q of the RF coil. In NQR, due to the nature of the object, the object does not cause as much reduction in Q as in MRI, at about the same proximity of the object to the RF coil.

In order to concurrently detect multiple spectral lines using prior art narrowband NQR systems, the RF resonance circuit can be tuned to multiple resonance frequencies. In this case, however, a dedicated receiver channel is required for each and every spectral line of interest, because of the narrowband nature of the system.

Figure 2:
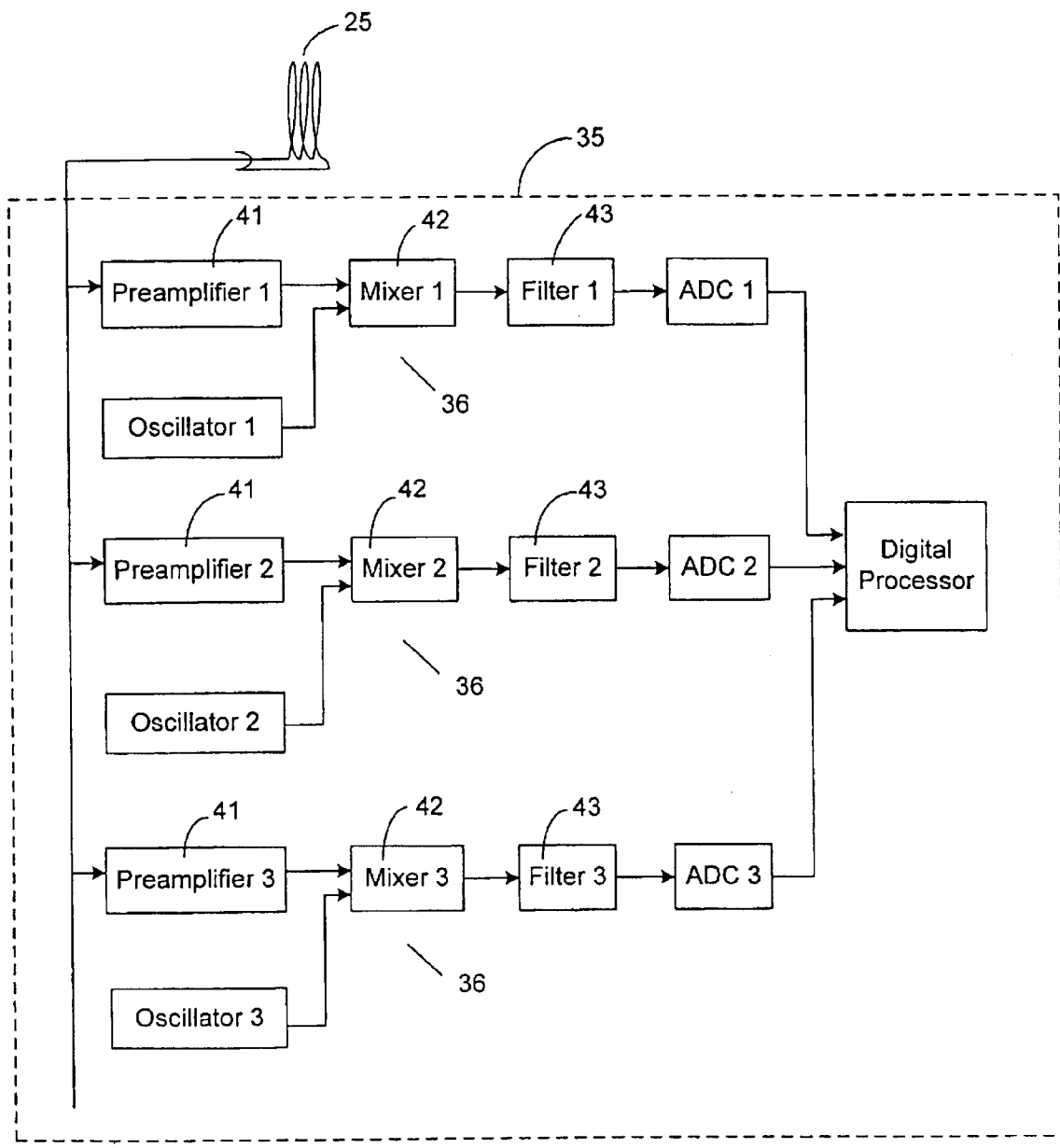
FIG. 2 shows an RF coil and a receiver, in a prior art narrowband NQR system that includes a single RF coil tuned to multiple frequencies.

FIG. 2 shows an RF coil 25 and a receiver 35, in a prior art narrowband NQR system that includes a single RF coil tuned to multiple frequencies. Each of the multiple resonant frequencies is made to match to a characteristic transition frequency of an NQR spectral line of interest. As seen from FIG. 2, a receiver channel 36 is provided for each one of the frequencies to which the RF coil is tuned. Each receiver channel 36 includes a preamplifier 41, a mixer 42, and a filter 43, all of which are tuned to the center frequency of a spectral line, over a narrow range. The complexity of the receiver system, as well as the cost of the NQR detection system, are substantially increased.

A serious limitation of the narrowband NQR system of FIG. 2 is that the multiple tuned frequencies must be fairly far apart from each other. Thus, if the center frequencies of two or more spectral lines are close to each other, whether coming from the same compound or from a different one, the response signals for these spectral lines cannot be acquired simultaneously, even if the RF coil is tuned to multiple frequencies.

The present invention features a wideband NQR system, in which the RF coil system includes a plurality of coils, and is designed and used in a way that permits the excitation and detection of many NQR spectral lines at the same time. The present invention is predicated in part on the realization that as long as the RF fields generated by each of a plurality of coils are substantially de-coupled from each other, for example by virtue of being mutually orthogonal, a plurality of coils can be operated simultaneously, each coil functioning entirely independently and without affecting the operation of any other coil.

In the present invention, therefore, a plurality of RF coils are used, each RF coil being shaped and configured so that each coil generates an RF field that is substantially de-coupled from the RF fields generated by other coils. Each RF coil operates without any interference from each other. In a preferred embodiment, each coil generates an RF field that is substantially orthogonal to the RF fields generated by the other coils. In the present application, the term "orthogonal coils" shall henceforth mean coils that generate mutually orthogonal RF fields, and the term "de-coupled coils" shall henceforth mean coils that generate mutually de-coupled RF fields. Also, in the present application, an RF coil is defined as a coil constructed and arranged to generate an RF field in one direction only.

Figure 3:
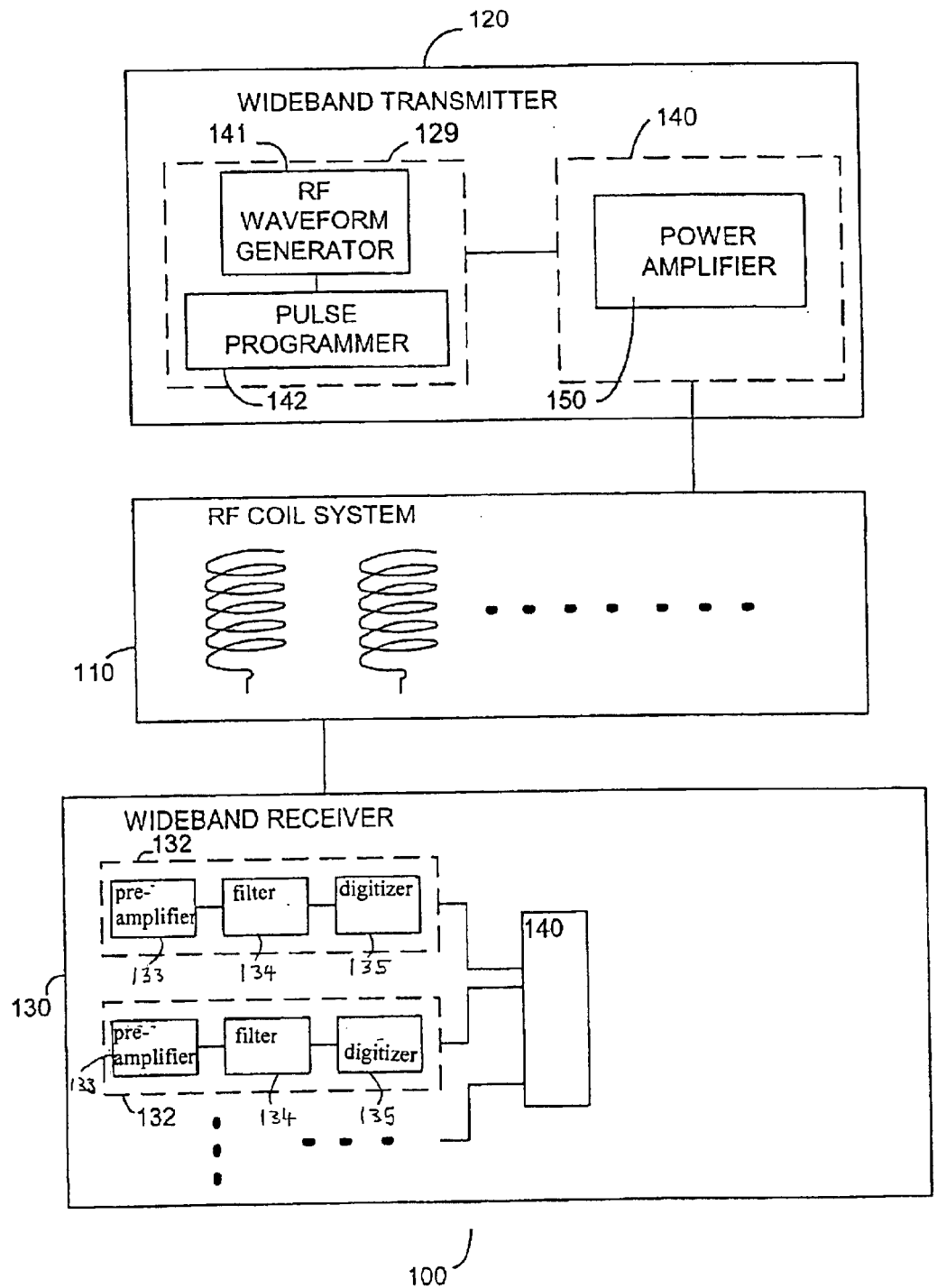
FIG. 3 illustrates a schematic block diagram of an overview of a wideband NQR system constructed according to the present invention.

FIG. 3 illustrates a schematic block diagram of an overview of a wideband NQR system 100, constructed in accordance with the present invention. The NQR system 100 includes an RF coil system 110 that includes a plurality of RF coils for exciting and detecting a plurality of NQR spectral lines, simultaneously. The NQR system 100 further includes: 1) a transmitter 120 for generating pulsed RF waveforms, and transmitting the pulsed RF waveforms to each RF coil; and 2) a receiver 130 for receiving the NQR response signals, detected by the coils.

The transmitter 120 is preferably a wideband transmitter. The wideband transmitter 120 may include pulse generating means 129, and pulse driving means 140. The pulse generating means 129 may, in one embodiment, include an RF waveform generator 141, and a pulse programmer 142 for programming desired pulse shapes and sequences. The pulse driving means 140 may, in one embodiment, include a power amplifier 150, and a coupling network (not shown) for coupling the RF pulses from the power amplifier 150 to the RF coil system 110. The width of a RF pulse may typically be in the order of less than 0.1 milliseconds.

The RF coil system 110 is critical to the overall performance of the wideband system 100. In the wideband NQR system 100, the RF coil system 110 includes at least two de-coupled orthogonal RF coils, each RF coil being shaped and configured to excite and detect a plurality of NQR spectral lines, simultaneously. Preferably, the RF coil system includes a third de-coupled coil. The de-coupled RF coils may be orthogonal RF coils. In an embodiment including three orthogonal RF coils, each coil in the RF coil system generates (when driven by RF pulses generates by the transmitter 120) mutually orthogonal RF fields in the x-, y-, and z-directions, respectively, assuming that a Cartesian coordinate system is used to describe the NQR system. Preferably, each RF coil transmitting the RF pulses is also used to detect NQR response signals.

In some applications, the object being detected may be part of a package or a luggage item, i.e. the chemical compound containing the quadrupolar nuclei to be detected may be concealed within a package or a luggage item. For applications such as checking a package placed on a conveyer belt, the RF coil system 110 is preferably characterized by a closed configuration, i.e. defines a hollow interior region. In other words, the RF coil system 110 is configured to surround the package being detected, as the package is moved into and out of a detecting volume defined by the coils. When these de-coupled RF fields are applied to a desired volume or region of the package, for example by passing the package through the closed volume defined by the coils, nuclear quadrupole resonances can be excited within the desired region, provided the oscillation frequencies of the RF fields match the characteristic transition frequencies of these resonances.

In other applications, the object is not wholly accessible, for example in applications such as the detection of land mines, or the detection of a region near the surface of a large object. In these applications, the coils are not constructed to define a large volume enclosing the object. Rather, the de-coupled coils can be constructed on a surface or within a thin volume, by analogy to the construction of surface coils in MRI. Such coils can be placed against the package or other types of object, in order to detect the regions underneath the surface. These coils are substantially de-coupled from each other, although the physical geometry of the coils may not appear to be orthogonal to each other.

The receiver 130 is preferably a wideband receiver, and is adapted to receive from each RF coil the NQR response signals that have been detected by the particular RE coil. In one embodiment, the receiver 130 may include a receiver channel 132 for each RF coil. By analogy to the prior art NQR systems described in FIGS. 1 and 2, each receiver channel 132 typically includes a wideband preamplifier 133, a wideband filter 134 for filtering the output RF signal from the preamplifier, and a digitizer 135 for digitizing the filtered RF signal. The receiver 130 may also include a digital processor 140 for processing the digitized output signals from each receiver channel 132, so that the NQR spectral line information can be extracted.

Figure 4:
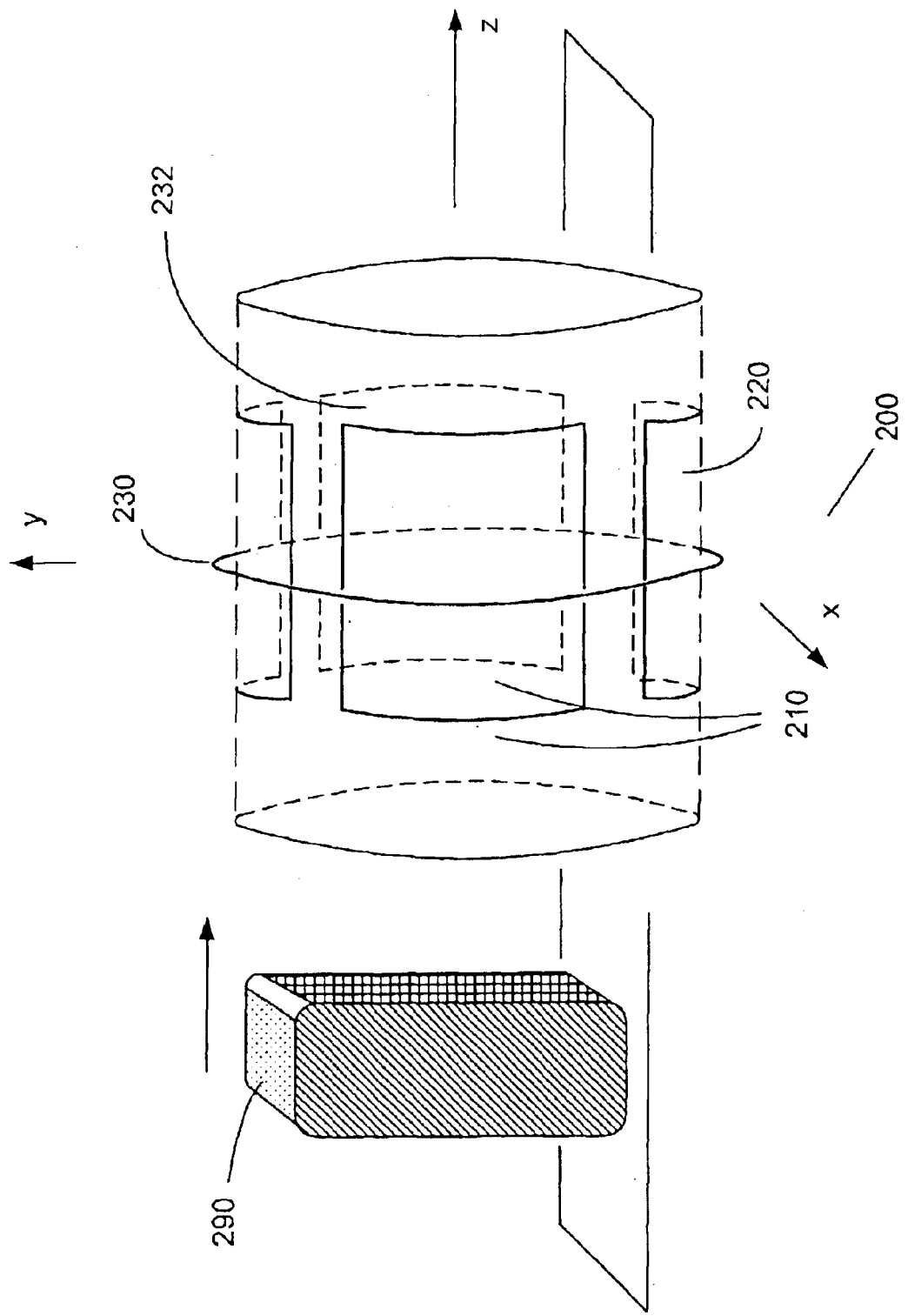
FIG. 4 schematically illustrates an RF coil system constructed in accordance with one embodiment of the present invention, and including three RF coils shaped and configured to generate mutually orthogonal and de-coupled RF fields along the x-, y-, and z-directions, respectively.

FIG. 4 schematically illustrates an RF coil system 200 constructed in accordance with one embodiment of the present invention. In the illustrated embodiment, the RF fields generated by the RF coils of the RF coil system 200 are mutually orthogonal, and therefore de-coupled from each other. If a Cartesian coordinate system is used to describe a package-object 290 that is being detected, the RF coil system 200 in FIG. 4 includes three RF coils shaped and configured to generate substantially dc-coupled RF fields which are mutually orthogonal and aligned along the x-, y-, and z-directions, respectively. In this application, the three coils will be referred to as the x-coil 210, the y-coil 220, and the z-coil 230. The coils excite and detect RF fields in the x-, y-, and z-directions, respectively.

In the exemplary embodiment illustrated in FIG. 4, the compounds containing quadrupolar nuclei are contained within the package-object 290, which is translated along the z-direction, to the center of a detecting volume 232 defined by the coils, for NQR detection. In the illustrated embodiment, the z-coil 230 is a solenoid coil, which leaves an opening in the z-direction, and allows the package-object 290 to move in and out of a detecting volume defined by the coils. The x-coil 210 and the y-coil 220 are saddle-shaped coils. It is understood, however, that any coil geometry and configuration are within the scope of the present invention, as long as each of the plurality of coils generate RF fields that are substantially de-coupled from each other, for example by being mutually orthogonal.

Figure 5A:
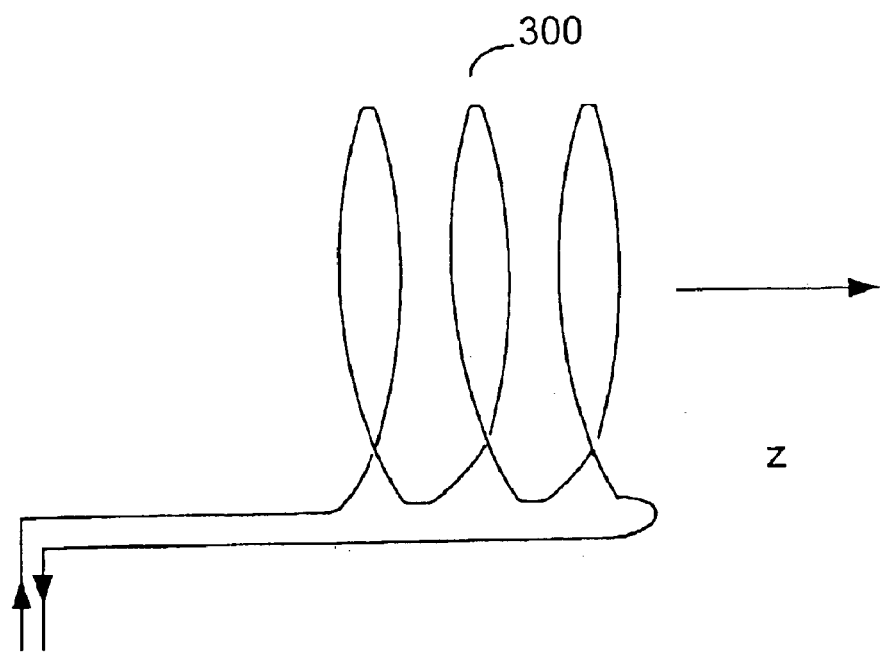
FIG. 5A schematically illustrates a solenoid-shaped coil which generates and detects RF fields in the z-direction.
Figure 5B:
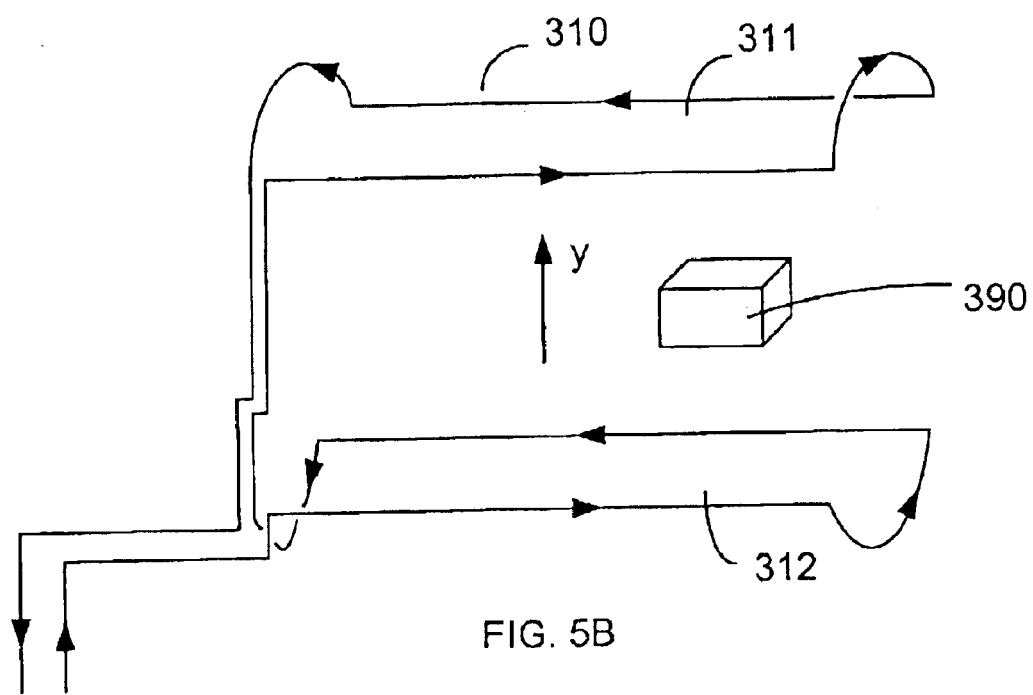
FIG. 5B schematically illustrates a saddle-shaped coil which generates and detects RF fields in the y-direction.

FIG. 5A illustrates in more detail a solenoid-shaped coil 300 which generates and detects an RF field in the z-direction, whereas FIG. 5B illustrates in more detail a saddle-shaped coil 310 which generates and detects an RF field in the y-direction. As illustrated in FIGS. 5A and 5B, the RF coils 300 and 310 can be constructed so as to include multiple turns and multiple parts. The saddle-shaped coil, illustrated in FIG. 5B, consists of two parts 311 and 312, mounted on either side of an object 390. Each part may have multiple turns.

In the embodiments illustrated in FIGS. 4, 5A, and 5B, each coil is tuned to at least one resonant frequency that substantially matches a characteristic spectral frequency of an NQR spectral line. Preferably, each RF coil is multiply tuned to a plurality of resonant frequencies, so that each coil can concurrently detect a plurality of spectral lines. Each resonant frequency, for a given RF coil, corresponds to a characteristic spectral frequency of a respective one of the NQR spectral lines that are being detected. The tuned frequencies are well separated, so that the resonant circuit can achieve multiple tunings with good performance. On the other hand, any one of the frequencies of one RF coil can be as close as necessary to any one of the frequencies of any other RF coil. This allows spectral lines at close frequencies to be detected simultaneously, by different coils. A resonant frequency of one coil may be substantially identical to a resonant frequency of another coil. Each of the plurality of coils is used to excite and detect substantially the same volume or region within an object, at the same time. Typically, the object includes molecular compounds containing quadrupolar nuclei, for example chemical compounds such as TNT, RDX, HMX, PETN, cocaine and heroine.

It is important not to confuse the multi-coil system featured in the present invention with the quadrature coils used in NMR. The multi-coil system of the present invention is also different from the so-called coil array or surface coils in MRI, where each coil detects a separate region of the object. There are major differences between the NMR quadrature coils, and the multi-coil system of the present invention. First, the possibility of using three orthogonal coils is unique to NQR. In NMR spectroscopy or in MRI imaging systems, the RF fields have to be substantially perpendicular to the static magnetic field, and thus are limited to two dimensions. Because each of the plurality of NMR quadrature coils must be orthogonal to the external B-field, not more than two orthogonal coils can be used, since it is not possible to construct a third orthogonal coil that can generate an RF field that is orthogonal both to the external B-field and to the fields generated by the other two orthogonal coils. In an NQR system, on the other hand, the non-uniform E-field provided by the molecules within an object obviates the need for a homogeneous external B-field, and thus there is no constraint requiring the RF fields to be orthogonal to a certain B-field direction.

Even if only two of the three possible orthogonal coils were used for an NQR system constructed in accordance with the present invention, the nature of these two coils is different from the so-called quadrature coils in NMR spectroscopy or MRI imaging systems. Each of the multiple NMR quadrature coils must be tuned to the same frequency, or same frequencies. Also, only one, or none, of the two NMR quadrature coils is used for both excitation and detection of NMR signals. In contrast, in the multi-coil system of the present invention, each coil is preferably tuned to different sets of frequencies, and each coil operates in a way that is entirely independent from each other. Also, each of the coils in the NQR multi-coil system of the present invention is preferably used to both excite NQR resonances, and to pick up the resulting response signals from the object.

In NMR, the quadrature coils operate together coherently, rather than independently as in the NQR coil system of the present invention. The NMR or MRI quadrature coils are used to detect the same signal, with the same tuning. The signal is excited by a single source, which may be one of the quadrature coils, or a third coil. If a third coil is used, it generates an RF excitation field in the direction of either coil, or in a direction somewhere in between. The RF field is far from being orthogonal to both quadrature coils. Also, signals obtained from MRI quadrature coils are phase sensitive. The signals are combined or processed according to 90° out-of-phase relationships. These kinds of quadrature coils would offer no advantage, for purposes of NQR signal detection. Due to the random orientation of the electric field gradient in a powdered crystalline solid, if one quadrature coil were to be used for excitation, the other quadrature coil would not pick up much of the NQR signal.

Figure 6:
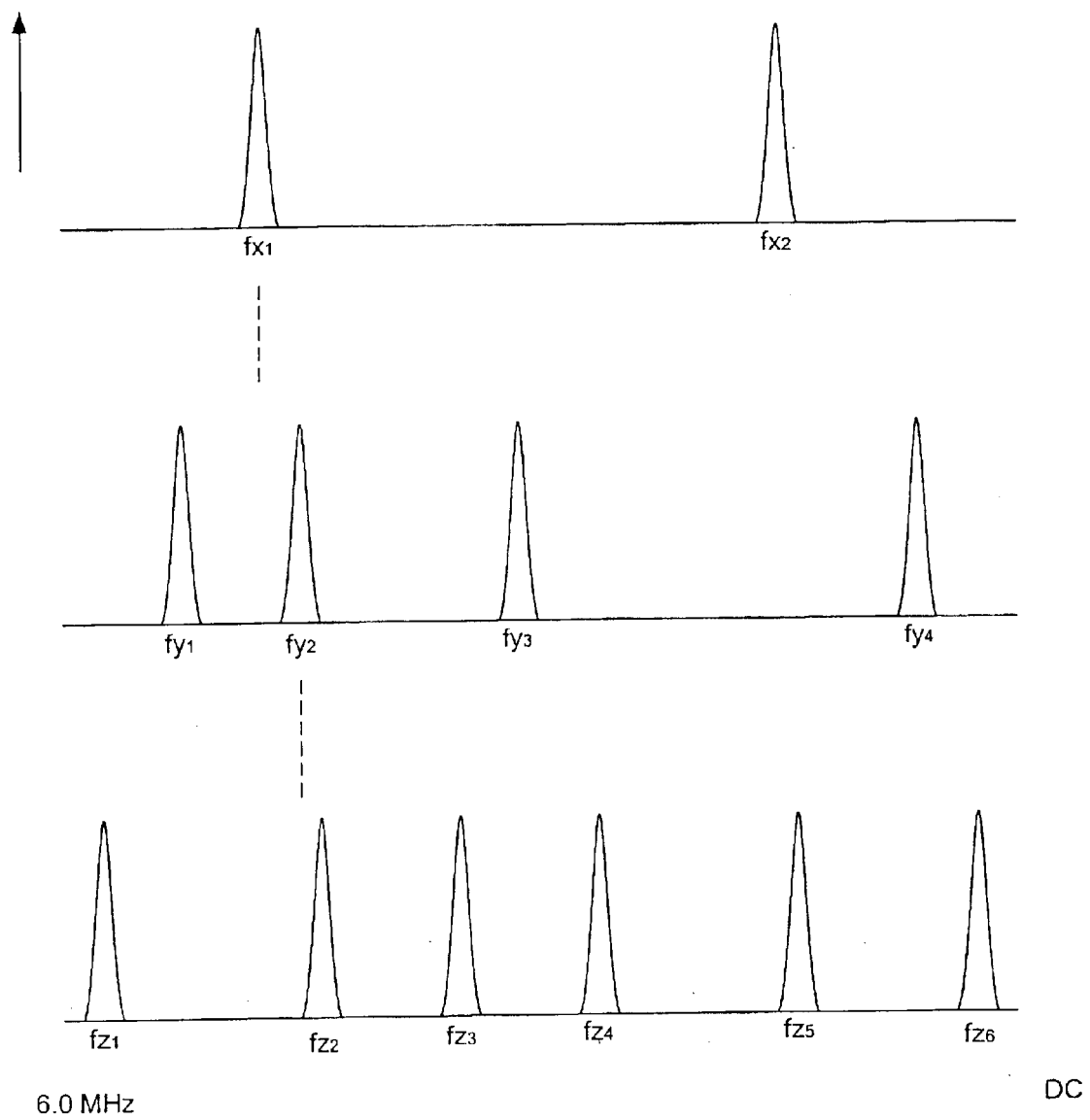
FIG. 6 illustrates the frequency response for a set of coils constructed in accordance with one embodiment of the present invention, and including three RF coils ("x-coil, y-coil, and z-coil") shaped and configured to generate mutually orthogonal and de-coupled RF fields in the x-, y-, and z-directions, respectively. The x-, y- and z-coils are tuned to two, four, and six narrow-band frequencies, respectively, over the frequency range from DC to 6.0 MHz.

FIG. 6 illustrates the frequency response for a set of coils constructed in accordance with one embodiment of the present invention, and including three orthogonal RF coils ("x-coil, y-coil, and z-coil"), shaped and configured to generate mutually orthogonal and de-coupled RF fields in the x-, y-, and z-directions, respectively. The x-, y- and z-coils are tuned to two, four, and six narrow-band frequencies, respectively, over the frequency range from DC to about 6.0 MHz.

In the illustrated exemplary embodiment, the x-coil is doubly tuned to frequencies $f_{x1}$, $f_{x2}$, the y-coil is quadruple tuned, to frequencies $f_{y1}$, $f_{y2}$, $f_{y3}$, $f_{y4}$, and the z-coils are six-fold tuned, to frequencies $f_{z1}$, $f_{z2}$, $f_{z3}$, $f_{z4}$, $f_{z5}$, $f_{z6}$. The overall frequency response of these coils is depicted in FIG. 6. In this illustration, $f_{x1}$, $f_{z2}$, and $f_{z2}$ are adjacent to each other, i.e. very close together. In combination, therefore, the three coils can detect three closely spaced spectral lines, at these three frequencies.

Figure 7:
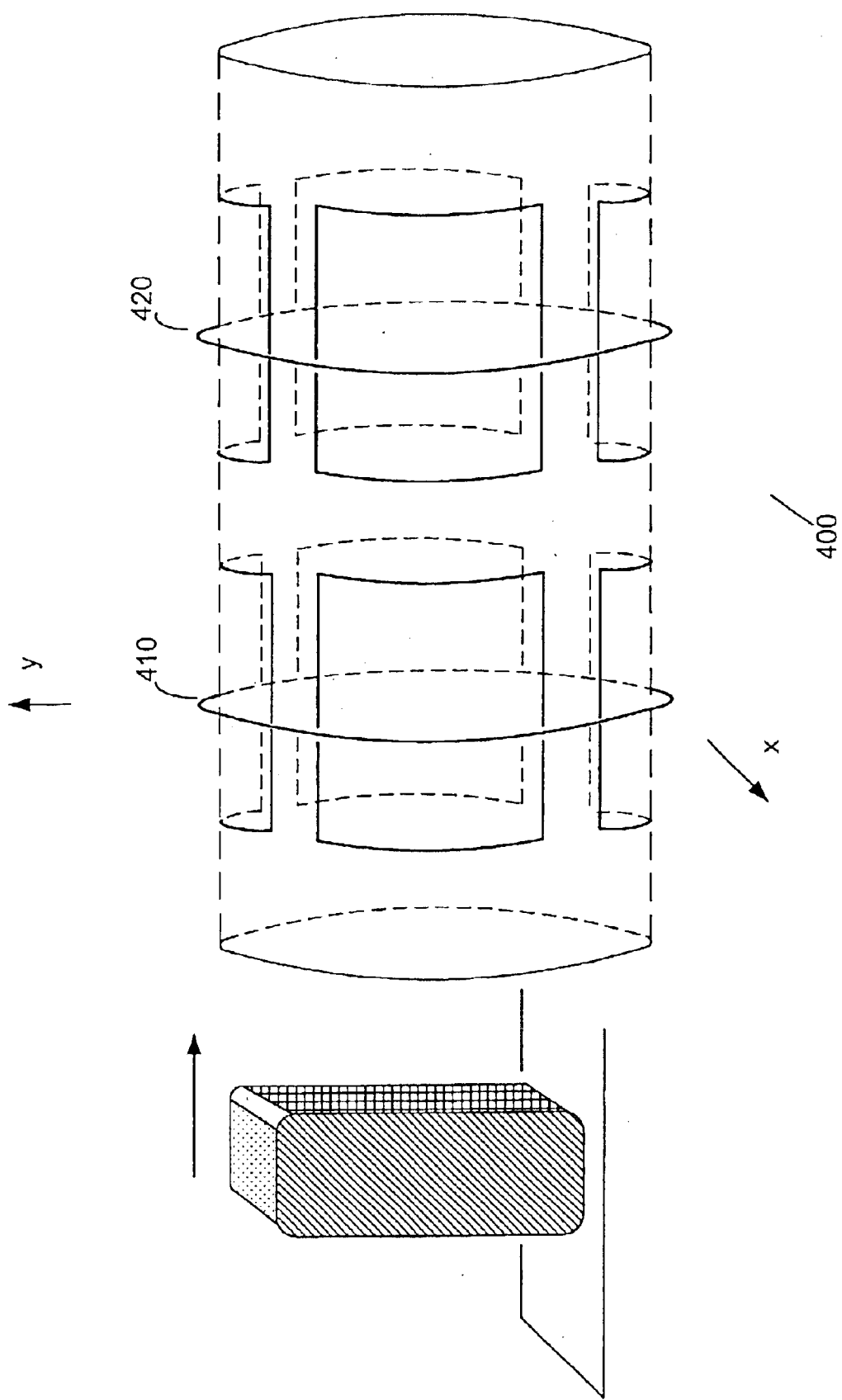
FIG. 7 illustrates an RF coil system constructed in accordance with another embodiment of the present invention, in which two sets of coils, each including a plurality of RF coils, are used to increase the measurement throughput and accuracy.

Multiple sets of RF coils, each set including a plurality of orthogonal coils, can be used to further enhance the detection of concealed contraband items, such as explosives and narcotics. FIG. 7 illustrates an RF coil system 400 constructed in accordance with another embodiment of the present invention, in which two sets of coils 410 and 420, each including three orthogonal RF coils, are used to increase the measurement throughput and accuracy. In the embodiment shown in FIG. 7, two regions within the object can be detected at the same time. The object is moved through the coils over a certain period of time, so that a given region or volume of the object is detected by both sets of coils, at different times. Each of the six RF coils is tuned to a set of multiple frequencies. Thus, it is possible to detect six spectral lines at close frequencies. One or more tuning frequencies for the first set can be the same as one or more tuning frequencies in the second set, for purposes of enhancing signal strength for certain weak spectral lines.

The tuning frequencies of the second set 420 of orthogonal coils can even be identical to the tuning frequencies of the first set of orthogonal coils. The purpose for tuning in this way is to increase detection throughput or to enhance the accuracy of detection. In such an embodiment, the second set of orthogonal coils is an exact duplicate of the first set of orthogonal coils, so that a separate region is detected at the same time. If a region is detected only by one orthogonal set, the throughput rate is effectively doubled. If a region is detected by both orthogonal sets at different times, the NQR signal and hence the detection accuracy is enhanced.

Because the wideband NQR system, as proposed in the present invention, is typically a digital system, the RF pulses applied to the coils (in order to excite resonances) can be prepared digitally. The digitally prepared RF pulse waveform may be composed of multiple individual waveforms, each optimally prepared to excite one spectral line at a tuned frequency of the coil. In other words, the digitally prepared RF pulse may be formed as a superposition of a plurality of individual waveforms, each characterized by a different frequency. A single waveform, tailored to excite one spectral line, will hereinafter be referred to in this application as an "individual waveform."

Figure 8:
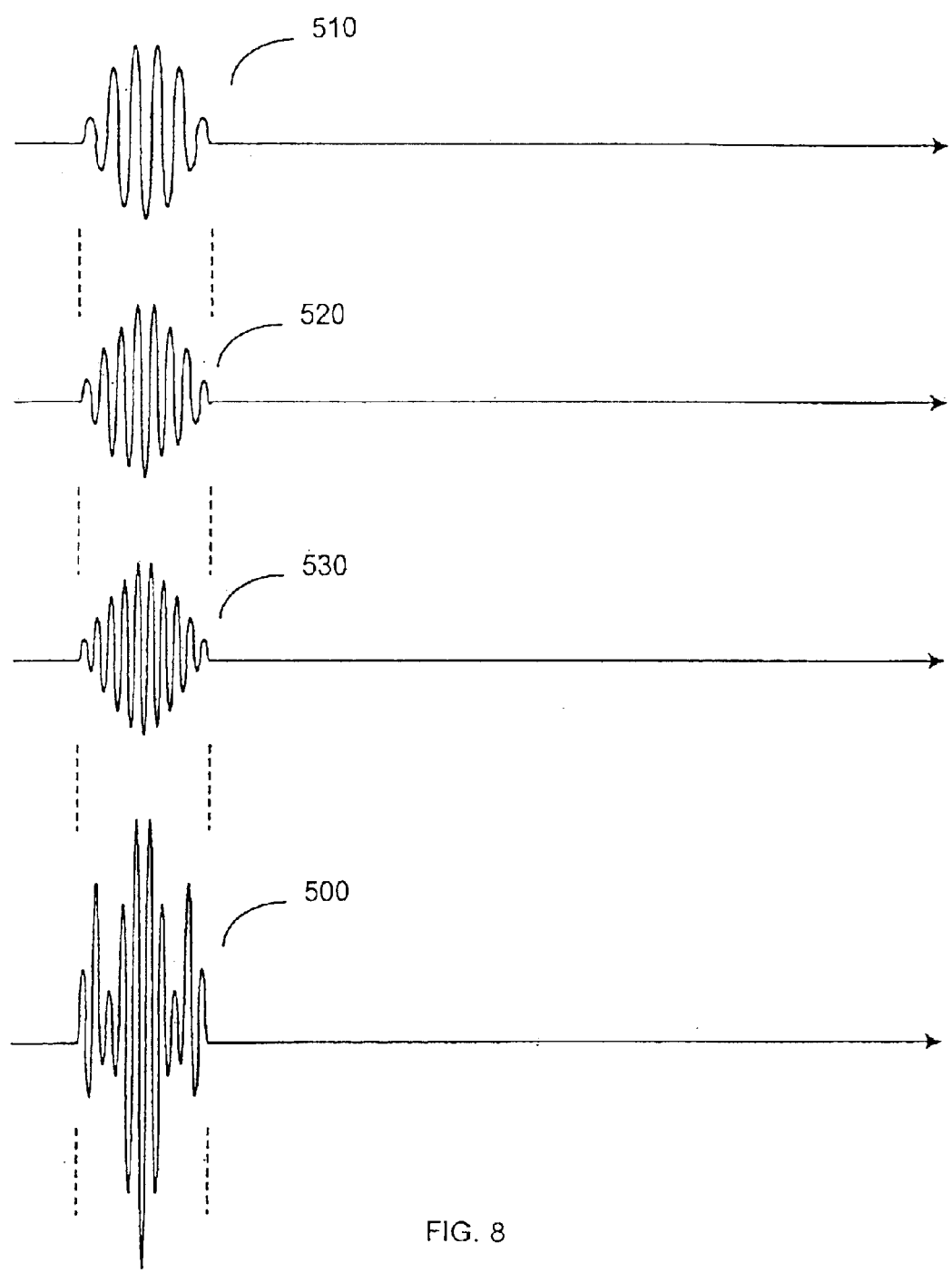
FIG. 8 illustrates a composite RF pulse summed from three individual waveforms, where each individual waveform is tailored to optimally excite a unique NQR spectral frequency.

FIG. 8 illustrates a composite RF pulse 500 summed from three individual waveforms 510, 520, and 530, where each individual waveform is tailored to excite a unique NQR spectral frequency. Each individual waveform is preferably amplitude modulated, for purposes such as minimizing the sidebands of the excitations, or enhancing the rise time of the pulses. It is desirable that all individual waveforms generate equal RF field strengths, in order for all spectral lines to be excited by the same degree of the so-called flip angle of the magnetization. Therefore, each individual waveform is preferably multiplied by a scaling factor. The scaling factor is used to compensate for slight differences in the sensitivity of the coils and in the gain of the power amplifier, at different RF frequencies. The waveform input into the power amplifier is the composite waveform, summed from the individual waveforms having substantially equal pulse widths, as shown in FIG. 8.

The composite waveform 500 can be digitally calculated in real time, or read out from a pre-calculated table. The composite waveform 500 is converted into an analog waveform, in order to be input into the power amplifier. For an alternative-phase pulse sequence, the same composite waveform can be used to generate the 180° pulse, by multiplying the waveform by −1. For pulse sequences with several different phases, the phase of the individual waveform is shifted, before being summed so as to form the composite waveform. If the different phases arc limited to 0°, 90°, 180°, and 270°, for example, four composite waveforms can be pre-calculated as tables with these four different phases, for fast readout.

In an embodiment of the invention in which the RF pulses are formed from digitally prepared pulses, the NQR system may include a wideband transmitter, having pulse generating means for generating a sequence of RF pulses, and a power amplifier for driving the RF coils with the RF pulses. The pulse generating means may include an RF waveform generator and a pulse programmer. The RF waveform generator prepares the individual digital waveforms and generates the composite waveform from the constituent individual waveforms. The pulse programmer generates the pulse sequences, as well as the real-time signals controlling the operation of the transmitter system and the receiver system.

When the individual waveforms 510, 520 and 530 are combined into the composite waveform 500, the dynamical range of the composite waveform increases. The power requirement for the power amplifier also increases. Three different transmitter channels can share the dynamic range and power load for the three coils. However, since the frequency ranges of these three coils are similar, it is also possible to use one transmitter channel with a single power amplifier, for all three coils. In that case, the composite waveform is summed from all the individual waveforms for all three coils. The transmitter channel must have an adequate dynamic range and an adequate power capability in the wideband power amplifier. The wideband power amplifier may have a bandwidth extending from about 0.5 MHz to 6 MHz.

The wideband excitation described above excites many narrowband frequencies. This is different from the stochastic excitation in NMR spectroscopy. In stochastic excitation, the phase, intensity, or width of the RF pulse are subjected to random changes. The stochastic excitation technique excites a sample with evenly distributed frequencies over a broad band, in contrast to the excitation of multiple narrowband frequencies featured in the present invention.

Figure 9:
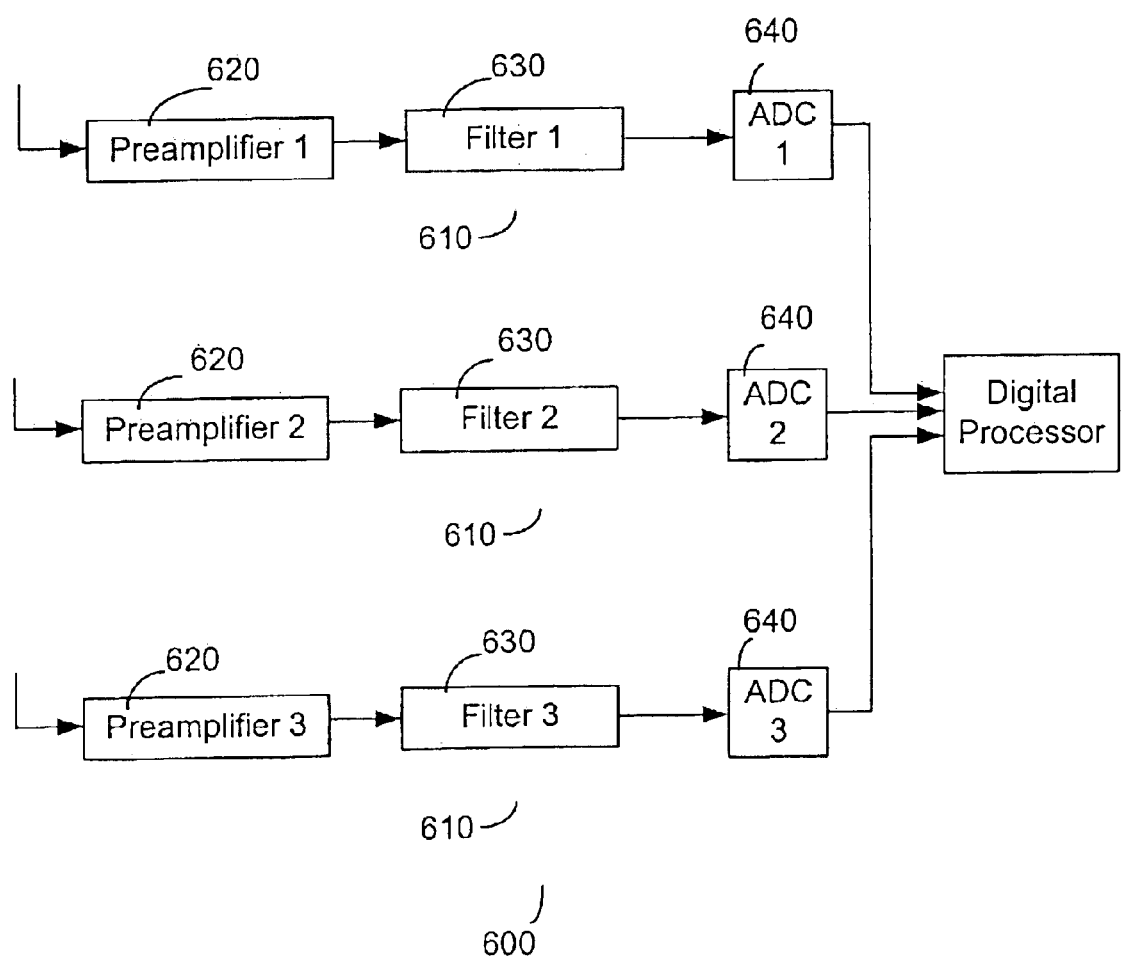
FIG. 9 illustrates a wideband receiver for an NQR system constructed in accordance with one embodiment of the present invention, and including a separate receiver channel for each orthogonal RF coil.

FIG. 9 illustrates a wideband receiver 600 for an NQR system constructed in accordance with one embodiment of the present invention, and including a separate receiver channel 610 for each de-coupled RF coil. The NQR signal from each coil is detected by one receiver channel. A single receiver channel is sufficient to detect all of the plurality of spectral lines excited by each multiply tuned coil. Each receiver channel 610 consists of a wideband preamplifier 620, a wideband filter 630, and a digitizer 640 characterized by an RF sampling rate, as shown in FIG. 8. The lowest spectral frequency of interest is denoted as $f_{min}$, and the highest spectral frequency of interest is denoted as $f_{max}$. The sampling rate of the digitizer 640 is selected to be at least twice the highest spectral frequency, namely $2f_{max}$.

The wideband preamplifier 620 receives the NQR signal from each coil. Preferably, the passband of the preamplifier 620 should range at least from about $f_{min}$ to about $f_{max}$. The wideband filter 630 is used to filter the output signal of the preamplifier 620. The purpose of the filter 630 is to prevent the noise outside the frequency range of interest from aliasing back into the frequency range of the digitized data. The filter 630 is thus an anti-aliasing filter. The low cutoff frequency of the filter 630 may range from DC to about $f_{min}$. The high cutoff frequency is preferably set at about $f_{max}$. If the high cutoff frequency of the anti-aliasing filter 630 is set at a frequency $f_{cutoff}$ that is greater than $f_{max}$, the digitizer's sampling rate should be raised to be at least $2f_{cutoff}$.

In an excitation that uses many pulses in a pulse sequence, the NQR signals are received and digitized between the pulses. The signals are digitally averaged many times, in accordance with the pulse sequence. The digitized and averaged data contain the spectral line information. The Fourier transformed results provide the spectral lines near the tuned frequencies.

Although the Fourier transformed results cover frequencies from DC to $f_{max}$, only the spectrum near the tuned frequencies is useful. The spectrum outside the narrowband tuned frequencies contains mainly noise. The wideband digital data can potentially yield the entire spectrum of NQR spectral lines. The extent of usable spectral lines is limited only by the number of tuned frequencies in the coils.

In conventional NQR systems, a mixer is used to shift down a radio-frequency signal into an audio-frequency signal, for digitization. If thc RF signal is received from a multiple-tuned coil, multiple receiver channels are required for the processing of the multiple tuned frequencies. The wideband receiver system featured in the present invention does not need to use a mixer. The original signal can be digitized directly, with no need to downshift. More importantly, only one receiver channel is needed to generate all of the spectral lines detected from one coil.

In sum, the wideband NQR system featured in the present invention can generate many, if not all, of the spectral lines of interest, simultaneously. It consists of an RF coil system with a plurality of de-coupled RF coils, preferably three de-coupled and orthogonal RF coils. Each RF coil is excited by a wideband transmitter, and detected by a wideband receiver. Because of the concurrent operation of multiple tuned frequencies, the NQR system of the present invention can substantial increase the overall speed, or throughput, of detecting concealed narcotics or explosive materials. More importantly, the high-speed detection is achieved without degrading the signal-to-noise ratio obtained in conventional prior art systems having only a single spectral line detection capability.

In addition to being capable of multiple-line excitation and detection, the wideband NQR system of the present invention is capable of performing with a pulse sequence, as in conventional narrowband systems. The pulse phase, pulse width, and pulse repetition rate can be operated in the same manner as in prior art narrowband systems. But because of its multiple-line excitation capability, the wideband NQR system of the present invention requires a higher dynamic range in transmitting the pulse waveform, and greater power in operating the RF amplifier. On the receiver side, the system of the present invention also requires a faster digitization rate and more computational power, in order to concurrently generate a multi-line spectrum.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An NQR (nuclear quadrupole resonance) system for detecting NQR spectral lines from an object containing a plurality of quadrupolar nuclei, the system comprising:
   A. a transmitter for generating and transmitting RF signals;
   B. at least two RF coils shaped and configured to generate, when driven by said RF signals, RF electromagnetic fields that are substantially de-coupled from each other, so that a plurality of nuclear quadrupole resonances are excited when said de-coupled RF fields are applied to at least a portion of said object at frequencies matching characteristic transition frequencies for said resonances, said RF coils being operable to detect NQR response signals from said object; and
   C. a receiver for receiving said detected NQR response signals.

2. An NQR system according to claim 1, wherein said RF fields generated by said at least two RF coils are substantially orthogonal to each other.

3. An NQR system according to claim 1, wherein each RF coil is tuned to at least one resonant frequency substantially matching a characteristic spectral frequency of one of said NQR spectral lines.

4. An NQR system according to claim 1, wherein each RF coil is multiply tuned to a plurality of resonant frequencies for concurrent detection by said coil of a plurality of NQR spectral lines, and wherein said plurality of resonant frequencies for a given RF coil correspond to characteristic spectral frequencies of respective ones of said NQR spectral lines.

5. An NQR system according to claim 4, wherein at least one resonant frequency of a given RF coil is relatively close to a resonant frequency of another RF coil.

6. An NQR system according to claim 4, wherein at least one resonant frequency of a given RF coil is substantially identical to a resonant frequency of another RF coil.

7. An NQR system according to claim 1, wherein said RF signals comprise pulsed RF signals.

8. An NQR system according to claim 7, wherein each pulsed RF signal comprises a composite waveform formed as a superposition of a plurality of individual waveforms, each individual waveform being characterized by a frequency that substantially matches a characteristic spectral frequency of one of said NQR spectral lines.

9. An NQR system according to claim 1, wherein said object includes one or more chemical compounds, and wherein said chemical compounds include at least one of TNT, RDX, HMX, PETN, cocaine, and heroine.

10. An NQR system according claim 1, wherein each RF coil is operable both to excite at least one nuclear quadrupole resonance, and to detect the NQR response signal resulting from said resonance.

11. An NQR system in accordance with claim 1, wherein said transmitter comprises a power amplifier for driving said RF coils with said RF signals.

12. An NQR system in accordance with claim 1, wherein said transmitter comprises a wideband transmitter, and wherein said receiver comprises a wideband receiver.

13. An NQR system in accordance with claim 1, wherein said at least two RF coils are constructed and arranged so as to define a hollow interior region having a size sufficient to enclose said object therewithin.

14. A wideband NQR system according to claim 1, wherein said object forms part of a structure comprising at least one of a package item, and a luggage item.

15. An NQR system for simultaneously detecting a plurality of NQR spectral lines, the system comprising:
   A. means for generating pulsed RF signals;
   B. three RF coils shaped and configured so as to generate, when driven by said RF signals, substantially orthogonal and de-coupled RF electromagnetic fields in the x, y, and z directions, respectively;
   wherein upon transmission of said orthogonal RF electromagnetic fields by said RF coils onto a given region of an object containing quadrupolar nuclei, a plurality of nuclear quadrupole resonances can be concurrently excited in said region, and
   wherein said three RF coils are operable to detect from said object the NQR response signals resulting from said plurality of excited resonances; and
   C. means for receiving said NQR response signals from said RF coils.

16. A wideband NQR system for simultaneously detecting multiple NQR resonance frequencies, the system including:
   A. means for generating pulsed RF signals;
   B. at least a first set of RF coils and a second set of RF coils, wherein each set of coils comprises:
      a plurality of RF coils shaped and configured to generate, when driven by said RF signals, RF electromagnetic fields that are mutually orthogonal and substantially de-coupled, so that a plurality of nuclear quadrupole resonances can be excited simultaneously by applying said mutually orthogonal RF fields to at least a portion of an object containing quadrupolar nuclei, each RF coil being operable both to excite nuclear quadrupole resonances, and to detect the NQR response signals resulting from said excited resonances; and
   C. means for receiving respective NQR response signals from each of said plurality of RF coils in each set of coils.

17. A wideband NQR system for simultaneously detecting multiple nuclear quadrupole spectral lines, the system comprising:
   A. a wideband transmitter for generating and transmitting pulsed RF signals;
   B. a plurality of RF coils that are shaped and configured to generate, when driven by said RF signals, oscillating RF electromagnetic fields that are substantially de-coupled from each other, so that a plurality of nuclear quadrupole resonances can be excited simultaneously by applying said de-coupled RF fields to at least a portion of an object containing quadrupolar nuclei, at frequencies matching characteristic transition frequencies for said resonances, said RF coils also functioning as pickup coils for detecting the NQR response signals resulting from said excited resonances, each RF coil being tuned to a plurality of resonant frequencies corresponding to the characteristic spectral frequencies of respective ones of said resonances; and
   C. a wideband receiver for receiving from said RF coils said NQR response signals.

18. A wideband NQR system according to claim 17, wherein said wideband transmitter comprises:

a. pulse generating means for generating a sequence of RF pulses, wherein each RF pulse is a composite waveform formed as a superposition of a plurality of individual waveforms, each individual waveform being characterized by a different frequency; and wherein at least one of said plurality of individual waveforms is amplitude-modulated and scaled for excitation of an NQR spectral line at one of said tuned resonant frequencies of one of said RF coils; and b. at least one wideband power amplifier for driving said RF coils with said RF pulses generated by said pulse generating means.

19. A wideband NQR system according to claim 18, wherein said pulse generating means comprises a digital waveform generator for digitally computing said composite waveforms and the constituent individual waveforms.

20. A wideband NQR system according to claim 18, wherein one or more of said RF pulses is a combination of a plurality of said composite waveforms, each of said plurality of composite waveforms differing from each other in at least one of starting phase, pulse width, and amplitude modulation.

21. An NQR system according to claim 18, wherein each composite waveform comprises at least one of: 1) a waveform generated in real time; and 2) a waveform read out from a table of pre-computed waveforms.

22. A wideband NQR system according to claim 18, wherein said plurality of RF coils are driven by a single wideband power amplifier.

23. A wideband NQR system according to claim 17, wherein said wideband receiver comprises:

A. a receiver channel for each RF coil, each receiver channel including:

i. a wideband preamplifier, said wideband preamplifier having an input for receiving one or more NQR signals from each RF coil, and an output for providing an output RF signal;

ii. a wideband filter for filtering said output RF signal from said wideband preamplifier, so as to provide a filtered RF signal; and iii. a digitizer for digitizing said filtered RF signal so as to provide one or more digitized output signals from each receiver channel; and B. a digital processor for processing the digitized output signals from each receiver channel, so as to extract therefrom NQR spectral line information.

24. A wideband NQR system according to claim 23, wherein said digitizer is adapted to digitize said filtered RF signal without downshifting the frequency of said filtered RF signal.

25. A wideband NQR system according to claim 23, wherein said digital processor is adapted to average said digitized output signals in accordance with said sequence of RF pulses, and wherein said digital processor is further adapted to Fourier transform said digitized output signals so as to generate NQR spectral lines.

* * * * *